United States Patent [19]

Imaeda et al.

[11] Patent Number: 5,737,117
[45] Date of Patent: Apr. 7, 1998

[54] SECOND HARMONIC GENERATION ELEMENT AND A PROCESS FOR PRODUCING THE SAME

[75] Inventors: Minoru Imaeda; Katsuhiro Imai; Tatsuo Kawaguchi; Takashi Yoshino; Akihiko Honda, all of Nagoya, Japan

[73] Assignee: NGK Insulators, Ltd., Japan

[21] Appl. No.: 628,252

[22] Filed: Apr. 5, 1996

[30] Foreign Application Priority Data

Apr. 10, 1995 [JP] Japan ............................ 7-083938
Feb. 16, 1996 [JP] Japan ............................ 8-029207

[51] Int. Cl.[6] .................................................. G02F 1/37
[52] U.S. Cl. ........................ 359/332; 252/584; 359/328
[58] Field of Search .................. 252/584; 359/326–332; 372/21, 22; 385/122

[56] References Cited

U.S. PATENT DOCUMENTS 4,740,265  4/1988  Bierlein et al. .................. 385/131
5,581,396  12/1996  Kubota et al. ................... 359/332

FOREIGN PATENT DOCUMENTS

| | | |
|---|---|---|
| 0 409 339 A1 | 1/1991 | European Pat. Off. |
| 0 535 738 A2 | 4/1993 | European Pat. Off. |
| 0 768 393 A1 | 4/1997 | European Pat. Off. |
| 3-54117 | 3/1991 | Japan |
| 4-280891 | 10/1992 | Japan |
| 5-173213 | 7/1993 | Japan |
| 5-289131 | 11/1993 | Japan |
| 6-345588 | 12/1994 | Japan |
| 7-62585 | 3/1995 | Japan |
| 7-62586 | 3/1995 | Japan |

OTHER PUBLICATIONS

Japanese Journal of Applied Physics, vol. 33, No. 6A, Part 01, Jun. 1, 1994, pp. 3510–3513, XP000595748 Dae-Ho Toon et al.: "Growth and Characterization of K3LI2-XNB5+X015+2XC Micro Single Crystals Formed by the MU-Pulling Down Method For Blue SHG Applications" *the whole document*.

Applied Physics Letters, vol. 68, No. 6, Feb. 5, 1996, pp. 744–746, XP000556111 Furukawa Y et al: "Growth and Characterization of K3Li2(TAXNB1-X)5015 Crystals For Blue Second-Harmonic-Generation Applications" *the whole document*.

*Primary Examiner*—John D. Lee
*Attorney, Agent, or Firm*—Parkhurst & Wendel

[57] ABSTRACT

A second harmonic generation element including a single crystal substrate having a fundamental composition of $K_3Li_{2-2x}(Nb_{1-y}Ta_y)_{5+5z}O_{15-x+12.5z}$ and an optical waveguide made of an epitaxial film with a fundamental composition of $K_3Li_{2-2a}(Nb_{1-b}Ta_b)_{5+5c}O_{15-a+12.5c}$ and refractive index different from that of the single crystal substrate, wherein:

$-0.5 \leq a, x \leq 0.625$ $0 \leq b, y \leq 0.5$ $0.8 \leq (5-2x)/(5+5z), (5-2a)/(5+5c) \leq 1.2$.

32 Claims, 6 Drawing Sheets

FIG_1a
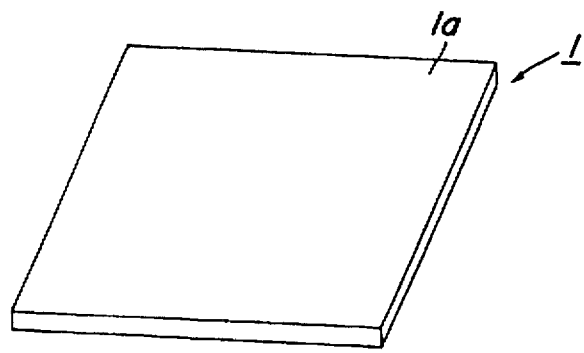
FIG_1b
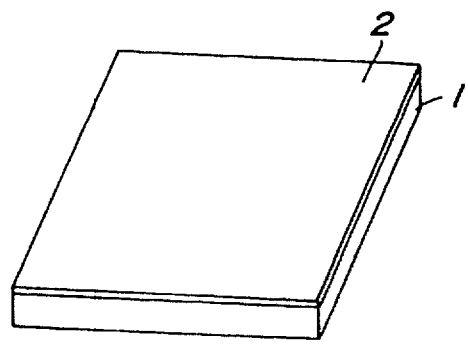
FIG_1c
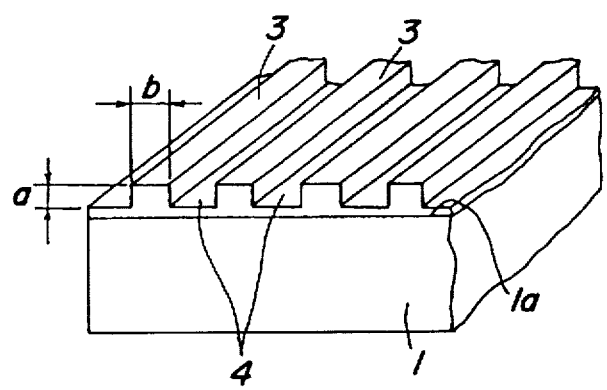

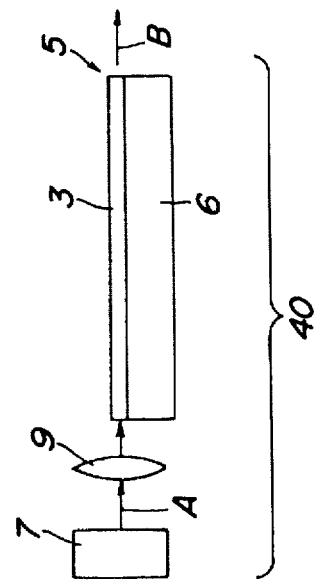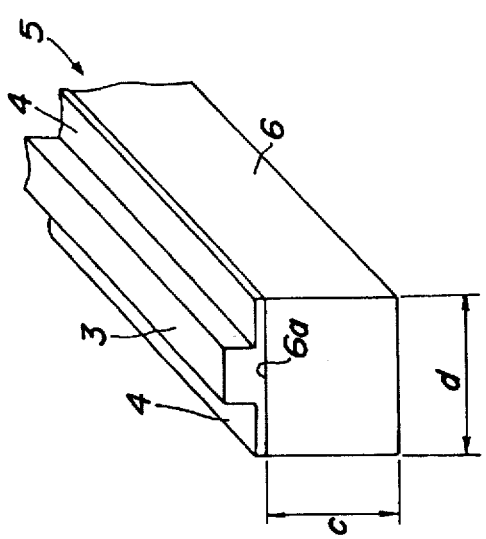

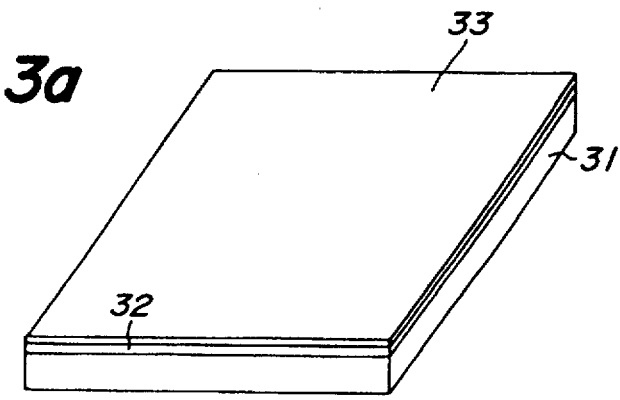
FIG_3a
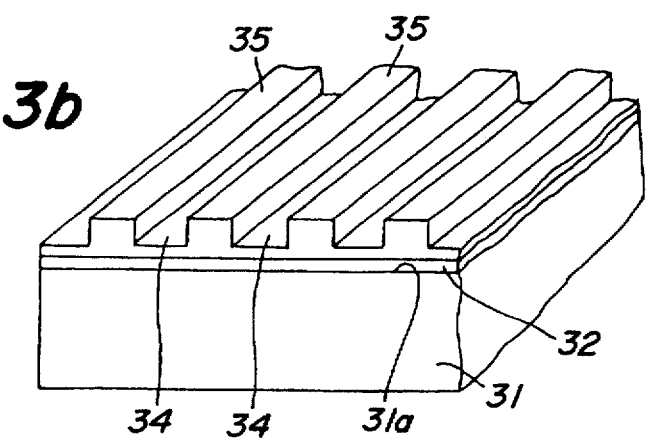
FIG_3b
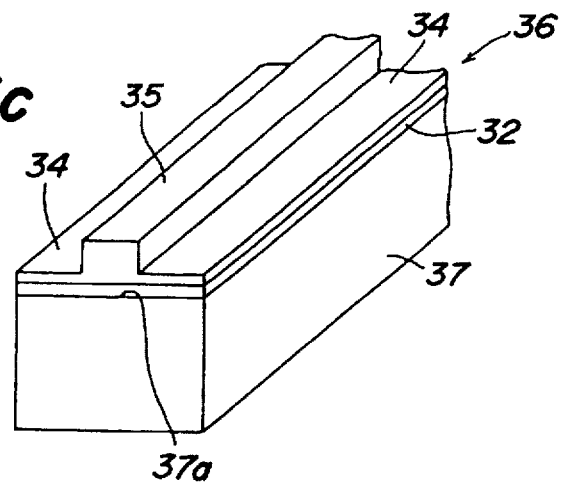
FIG_3c

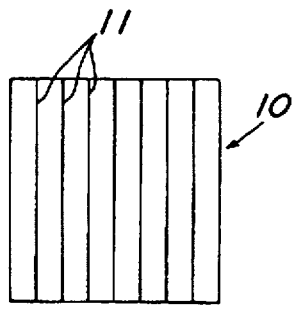
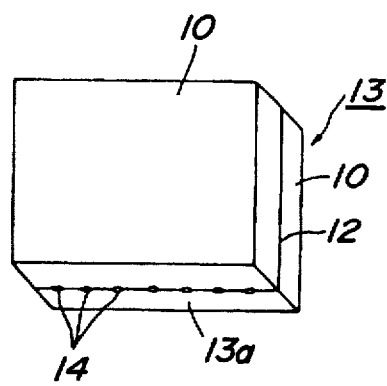
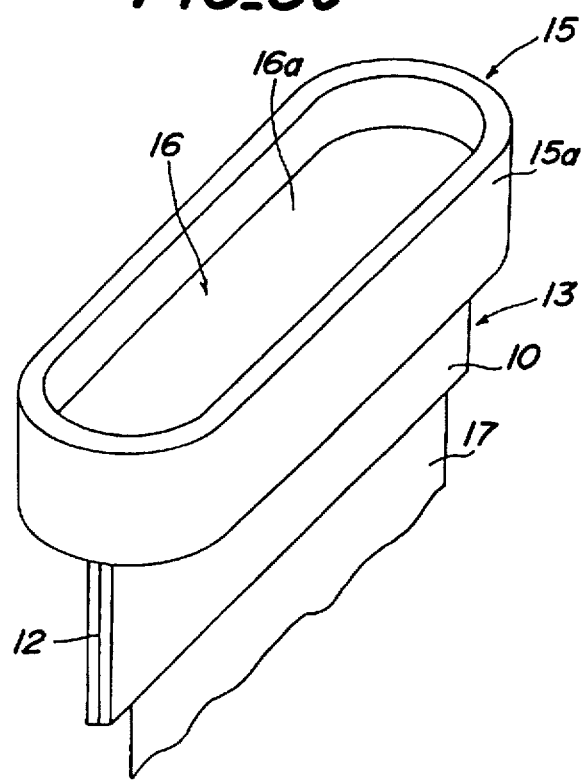

SECOND HARMONIC GENERATION ELEMENT AND A PROCESS FOR PRODUCING THE SAME

BACKGROUND OF THE INVENTION (1) Field of the Invention

The present invention relates to a second harmonic generation element to be suitably used in a blue light source device and a process for producing such a second harmonic generation element.

(2) Related Art Statement

In order to obtain the blue light source device, it is proposed that an optical waveguide having a domain-reversing structure is formed in a potassium titanyl phosphate ($KTiOPO_4$: KTP) or lithium nitride (LN) body so as to introduce a semiconductor laser beam in this optical waveguide (U.S. Pat. No. 4,740,265; Japanese patent application Laid-open No. 5-289,131, Japanese patent application Laid-open No. 5-173,213). However, although this technique requires the domains to be controlled at a high accuracy, such a high accuracy domain controlling is difficult. Further, a temperature acceptance for phase matching is ±0.5° C. Optical damage phenomenon occurs when over 3 mW light energy is put into the waveguide. For these reasons, it is pointed out that the above device has a practical problem.

Recently, a so-called μ (micro) pulling down process for producing an oxide type optical single crystal fiber has attracted attention. "DENSOUKEN NEWS" (Electrotechnical Laboratory) July 1993, vol. 522, pp 4–8, Japanese patent application laid-open Nos. 4-280,891 and 6-345,588 disclose the details of growing single crystal fibers made of potasium-lithium niobate ($K_3Li_{2-2x}Nb_{5+x}O_{15+x}$, hereinafter referred to "KLN") or the like by this process.

According to the process described in the above "DENSOUKEN NEWS", a cell or crucible is resistance heated by feeding electric power thereto. A melt drawing opening is formed at a bottom of the cell or crucible, and a rod member called a melt feeder is inserted through the melt drawing opening so that both a feed amount of the melt to the drawing opening and the state of a solid phase/liquid phase interface may be controlled. A KLN single crystal fiber having a small diameter is continuously formed by adjusting the diameter of the melt drawing opening, the diameter of the melt feeder, a projecting length of the melt feeder from the melt drawing opening, etc. According to this μ pulling down process, a single crystal having a diameter of not more than 1 mm can be formed, whereas thermal stress is reduced and convection in the melt and the diameter of the single crystal fiber can be easily controlled. In particular, it is reported that when a titanium sapphire laser is used, this KLN single crystal generates a blue light of 390 nm to 450 nm at room temperature by non-critical phase matching. None of conventional LN, KTP, KN (potassium nitride), etc. can generate such a blue light under the above conditions. Although Japanese Patent application Laid-open No. 3-54,117 describes a blue light-generating element made of a KLN crystal, an output is 380 nW (input is 70 mW), and the power of its bulk structure is small (See Example 2 of this publication). Further, in Example 3 of this publication, A film of KLN is formed on a sapphire substrate by sputtering or laser abrasion, so that an optical waveguide structure is formed by growing a single crystal layer having a high optical index on the sapphire substrate. Its output is 1 mW (input is 100 mW) and sufficient laser power is not obtained.

Further, a fundamental composition of KLN has been already disclosed so long as it gives tungsten-bronze structure (B. A. Scott et al., "Mat. Res. Bull." No. 5, pp 47–56, 1969). It is also disclosed that KLNT obtained through partially replacing a niobium component of KLN by tantalum has a similar property to that of KLN, a series of solid solutions having the composition of KLNT, can be produced by a Kyropoulas method (T. Fukuda et al, "J. Crystal Growth" No. 6, pp 293–296, 1970).

As mentioned above, it is known that the blue laser beam can be generated by using the KLN single crystal fiber grown by the above micro pulling down process under the condition of non-critical phase matching at room temperature. Further, the fundamental composition range of KLN which gives the tungsten-bronze structure is also known. However, a specific construction of an oscillator which effectively generates a blue laser beam by utilizing the KLN single crystal has not been proposed yet.

Although it may be considered that the KLN single crystal is used in the second harmonic generation element having the so-called oscillator construction, the second harmonic generation element of the oscillator construction will have a complicated structure, and be troublesome to assemble and impractical due to its low light conversion efficiency.

SUMMARY OF THE INVENTION

Under the circumstances, it is an object of the present invention to provide a second harmonic generation element which can generates a blue laser beam, has a simple structure to make its assembling easy, requires neither quasi-phase matching nor high accuracy domain controlling, has a wide temperature acceptance for the phase matching, and is not optically damaged even if a high energy is concentrated upon the element.

The present invention relates to the second harmonic generation element comprising a single crystal substrate having a fundamental composition of $K_3Li_{2-2x}(Nb_{1-y}Ta_y)_{5+5z} O_{15-x+12.5z}$ and an optical waveguide made of an epitaxial film with a fundamental composition of $K_3Li_{2-2a}(Nb_{1-b} Ta_b)_{5+5c}O_{15-a+12.5c}$ and refractive index different from that of the single crystal substrate, wherein:

−0.5≦a, x≦0.625

0≦b, y≦0.5

0.823 (5−2x)/(5+5z), (5−2a)/(5+5c)≦1.2

The present inventors have investigated the above mentioned KLN-based single crystal materials and the KLNT-based single crystal materials, and then succeeded in forming a KLN or KLNT single crystal film having excellent crystallinity on a substrate made of such a KLN or KLNT single crystal material through a liquid phase epitaxial growth process and at that time controlling the refractive index of each of the single crystal film and the single crystal substrate. The present inventors have also discovered that a practical blue light source device can be produced by forming an optical waveguide having a rib shape or the like by working the single crystal film. The present invention has been accomplished based on the above investigation and discovery.

The second harmonic generation element having the above optical waveguide structure has a ±2.5° C. temperature acceptance for phase matching, which is a sufficiently large value for a practical device. Further, optical damage has not been recognized for the above second harmonic generation element in a range of not more than 20 mW. In addition, the second harmonic generation element having the above optical waveguide structure has an extremely simple structure as mentioned later, and makes it easy to assemble an optical system. Thus, the second harmonic generation element is extremely practical from the standpoint of its production cost, etc.

As the above single crystal, it is preferable to use a single crystal substrate produced by a micro pulling down process proposed in JP-A 7-62585 and JP-A 7-62586 by NGK Insulators, Ltd. When the KLN or KLNT single crystal-growing process as disclosed in these publications is employed, the single crystal substrate having largely improved optical characteristics of the single crystal (variation in the wavelength of the phase matching and SHG conversion efficiency) can be stably mass-produced as compared with a case where the above single crystal is produced by the Kyropoulas method.

The second harmonic generation element according to the present invention can generate laser beam from blue region to ultraviolet up to 390 nm under the condition of non-critical phase matching at room temperature. Therefore, the second harmonic generation element according to the present invention can be applied to a wide range of optical disc memory field, medical field, optochemical field, various optical measurement fields, etc. by utilizing such a short wavelength light.

According to the present invention, the epitaxial film is preferably formed by the liquid phase epitaxial growth process. Since this process gives the epitaxial film having particularly high quality, no optical damage occurs even if a high density energy is concentrated in the optical waveguide. Therefore, a blue laser beam having a higher output can be produced as compared with a case of devices formed by the conventional sputtering process or diffusion process. The requirement that $0.8 \leq (5-2x)/(5+5z)$, $(5-2a)/(5+5c) \leq 1.2$ can be also written as $(-1-2x)/6 \leq z \leq (1-2x)/4$ or $(-1-2a)/6 \leq c \leq (1-2a)/4$.

These and other objects, features and advantages of the invention will be appreciated upon reading of the following description of the invention when taken in conjunction with the attached drawings, with the understanding that some modifications, variations and changes of the same could be made by the skilled in the art to which the invention pertains.

BRIEF DESCRIPTION OF THE DRAWINGS

For a better understanding of the invention, reference is made to the attached drawings, wherein:

FIG. 1(a) is a perspective view for illustrating an example of a single crystal substrate 1, FIG. 1(b) a perspective view illustrating the substrate upon which an epitaxial film 2 is formed, and FIG. 1(c) a partially perspective enlarged view of FIG. 1(b) in which the epitaxial film 2 is worked;

FIG. 2(a) is a perspective view showing a part of an optical waveguide element 5 cut from the worked product in FIG. 1(c), and FIG. 2(b) is a schematic view for illustrating a second harmonic generation element;

FIG. 3(a) is a perspective view for illustrating an example in which an epitaxial films 32 and 33 are formed on a single crystal substrate 31, FIG. 3(b) a partially perspective enlarged view illustrating the substrate in which the epitaxial film 33 in FIG. 3(a) is worked, and FIG. 3(c) a perspective view illustrating a part of an optical waveguide element 36 cut form the worked product in FIG. 3(b);

FIG. 5(a) is a plane view for showing a flat plate 10 formed with grooves 11, FIG. 5(b) a perspective view of a nozzle 13, and FIG. 5(c) a perspective view for illustrating preferable configurations of a crucible 15 with the nozzle 13.

DETAILED DESCRIPTION OF THE INVENTION

Figure 4:
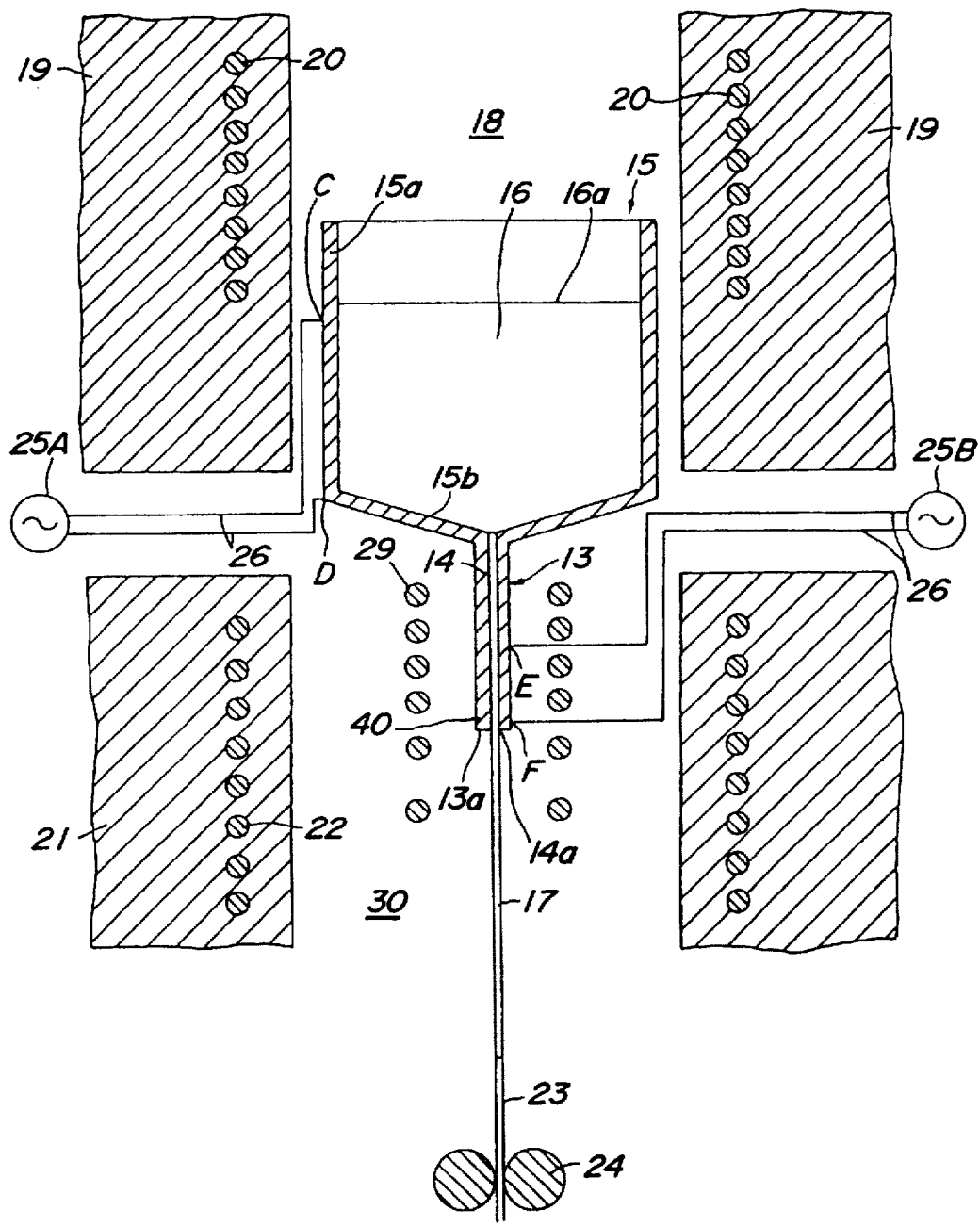
FIG. 4 is a schematically sectional view for illustrating a single crystal-growth apparatus.

First, preferred embodiments of the second harmonic generation element according to the present invention will be recited.

(1) The optical waveguide is formed directly on the single crystal substrate, and the refractive index of the optical waveguide is greater than that of the single crystal substrate.
(2) An intermediate film made of an epitaxial film having a fundamental composition of $K_3Li_{2-2d}(Nb_{1-e}Ta_e)_{5+5f}O_{15-d+12.5f}$ is formed on said single crystal substrate, said optical waveguide is formed on the intermediate film, the refractive index of the optical waveguide is greater than that of the intermediate film, and d, e and f satisfy the following inequations.

$$-0.5 \leq d \leq 0.625$$

$$0 \leq e \leq 0.5$$

$$0.8 \leq (5-2d)/(5+5f) \leq 1.2$$

(3) The epitaxial film constituting the optical waveguide is a film formed by liquid phase epitaxial growth. It is confirmed that the optical characteristics of the optical waveguide is further improved by this. Further, the epitaxial film constituting the intermediate film is preferably formed by the liquid phase epitaxial growth process.
(4) The single crystal substrate is a single crystal substrate grown by a micro (μ) pulling down process.
(5) When the epitaxial films constituting the optical waveguide and the intermediate film are to be formed by the liquid phase epitaxial growth process, the epitaxial film is preferably grown by contacting the single crystal substrate with a melt containing at least elements constituting said epitaxial film. The flux used at that time is known as an equilibrium melt phase if it has a composition in which a ratio of (K+Li) is greater that that of the intended epitaxial film but a ratio of (Nb+Ta) is smaller than that of the intended epitaxial film. Thus, the epitaxial film can be formed by the self flux growth.
(6) When the epitaxial films constituting the optical waveguide and the intermediate film are to be formed by the liquid phase epitaxial growth process, the epitaxial film is preferably grown by contacting the single crystal substrate with a melt containing at least elements constituting said epitaxial film and further vanadium oxide. It is known that when vanadium oxide is further incorporated into the melt, the supercooled state can be more readily controlled and a single crystal having better quality can be grown as compared with the case where the epitaxial film is grown by the self flux growth. In addition, an epitaxial film can be grown from a flux further added with boron oxide or the like.

In this case, a flux in which constituting metallic elements comprises vanadium and potassium is used, the single crystal having particularly excellent quality can be grown. The reason is that only K which is one of the constituent elements of KLN is contained besides vanadium.

Particularly, when an intermediate film is formed by contacting a single crystal substrate with the above melt and the intermediate film-formed single crystal substrate is contacted with another melt having a given composition different from that of the above, the epitaxial film for the formation of an optical waveguide can be continuously formed.

In the above fundamental compositions, a, b, c, d, e, f, x, y, and z need to fall in the following ranges. Although the respective chemical formulae of the fundamental compositions of the single crystal substrate, the intermediate film and the optical waveguide are the same excluding their suffixes, the actual chemical compositions differ among them in the second harmonic generation element. Therefore, different suffixes are given to their respective fundamental compositions.

The reason for the limitation that $-0.5 \leq a, d, x \leq 0.625$ is that the KLN material gives the tungsten-bronze structure in this composition range. If the composition has a ratio of potassium more than this range, it gives a $KNbO_3$ orthorhombic system, whereas a ratio of Li is more than this range, the composition gives a $LiNbO_3$ hexagonal system.

The reason for the limitation that $0 \leq b, e, y \leq 0.5$ is that as the substituting amount of Ta increases, a Curie temperature decreases, and that if b, e, y>0.5, the Curie temperature approaches room temperature so that a ferroelectric substance cannot be obtained and generation of the second harmonic wave is not recognized.

The reason for the limitation that $0.8 \leq (5-2x)/(5+5z)$, $(5-2a)/(5+5c) \leq 1.2$ is that this range is a range in which only a tungsten-bronze structure is obtained depending upon a ratio between (K+Li) and Nb in the case of pulling down growth process. According to this, a uniform single crystal can be grown over a composition range wider than that in which such a tungsten-bronze structure can be formed by the Kyropoulas method. In the present invention, the tungsten-bronze structure composed of K, Li, Nb, Ta and O is considered as the fundamental composition. So long as this structure is kept, these elements may be replaced or supplemented by another element or other elements, for example, K and Li are replaced by Na, Rb or the like, or a laser-oscillating dopant such as a rare earth element, say, Cr, Er, Nd or the like may be added.

According to the present invention, the KLN or KLNT single crystal substrate is produced through the micro pulling down process by the steps of obtaining a melt via melting the above materials in a crucible, contacting a seed crystal with the melt and pulling the melt down from the crucible. This process is suitable particularly for the production of the solid solution single crystals of KLN and KLNT.

In the following, examples of the present invention will be explained in more detail with reference to the attached drawings.

FIG. 1(a) is a perspective view for illustrating an example of a single crystal substrate 1, FIG. 1(b) a perspective view illustrating the substrate upon which an epitaxial film 2 is formed, and FIG. 1(c) a partially perspective enlarged view of FIG. 1(b) in which the epitaxial film 2 is fabricated. FIG. 2(a) is a perspective view showing a part of an optical waveguide element 5 cut from the fabricated product in FIG. 1(c), and FIG. 2(b) is a schematic view for illustrating a second harmonic generation element.

The planar shape of the KLN or KLNT single crystal substrate 1 is rectangular in FIG. 1(a), but the single crystal substrate is not particularly limited to the dimension and the shape shown. The epitaxial film 2 is formed on the surface 1a of the single crystal substrate 1. This film is preferably formed by the liquid phase epitaxial growth process, but a gas phase epitaxial process may be used for this purpose. Then, the epitaxial film 2 is fabricated to form, as shown in FIG. 1(c), plural rows of strip-shaped ridge type optical waveguides 3 with flat linear grooves 4 being formed on opposite sides of the optical waveguides 3. This step may be effected by using a photolithography technique.

Thereafter, the optical waveguides 3 are separated from one another by cutting along center lines of the grooves 4, thereby producing optical waveguide elements 5 as shown in FIG. 2(a). In the optical waveguide element 5, the optical waveguide 3 is formed on a surface 6a of the single crystal substrate 6 having a prism shape from the epitaxial film, and the grooves 4 are formed on the opposite sides of the optical waveguide 3.

The second harmonic generation element 40 as schematically illustrated in FIG. 2(b) is produced by using the above optical waveguide element 5. A laser beam source 7, an optical system 9 and the optical waveguide element 5 are arrayed as shown. An infrared beam is emitted from the laser beams source 7 to the optical system 9 as shown by an arrow A, and the laser beam is emitted from the optical system to one of end faces of the optical waveguide 3 of the optical waveguide element 5, and a second harmonic generation is emitted from the other end of the optical waveguide 3 as shown by an arrow B.

FIG. 3(a) is a perspective view for illustrating an example in which epitaxial films 32 and 33 are formed on a single crystal substrate 31, FIG. 3(b) a partially perspective enlarged view illustrating the substrate in which the epitaxial film 33 in FIG. 3(a) is fabricated, and FIG. 3(c) a perspective view illustrating a part of an optical waveguide element 36 cut form the fabricated product in FIG. 3(b).

The epitaxial films 32 and 33 are successively formed on the surface 31a of the single crystal substrate 31 by the liquid phase epitaxial growth process. Then, the epitaxial film 33 is fabricated to form, as shown in FIG. 3(b), plural rows of strip-shaped ridge type optical waveguides 35 with flat linear grooves 34 being formed on opposite sides of the optical waveguides 35. This step may be effected by using a photolithography technique.

Thereafter, the optical waveguides 35 are separated from one another by cutting along center lines of the grooves 34, thereby producing optical waveguide elements 36 as shown in FIG. 3(c). In the optical waveguide element 36, an intermediate film 32 made of the epitaxial film is formed on a surface 37a of the single crystal substrate 37 having a prism shape, and the optical waveguide 35 is formed on the intermediate film 32. The grooves are formed on the opposite sides of the optical waveguide 35. In this element, the laser beam is effectively confined inside the epitaxial film 33 by making an refractive index of the epitaxial film 33 greater than that of the epitaxial film 32.

In the KLN or KLNT composition, as the substituting amount of Ta increases, the refractive index of the single crystal decreases. As b, e, y increase, the refractive index decreases. In the KLN composition, as the amount of Nb increases, that is, as c, f, z increases, the refractive index of the single crystal increases.

A preferred example of the micro pulling down process for the production of the single crystal substrate will be explained with reference to FIGS. 4 to 6. FIG. 4 is a schematically sectional view for illustrating a single crystal-growing apparatus, and FIGS. 5(a) to 5(c) illustrating preferable configurations of a nozzle and a crucible 15 for growing the single crystal substrate. Inside a furnace, the crucible 15 is positioned. In this embodiment, the crucible 15 has a slender configuration to meet that of the single crystal substrate.

As shown in FIG. 5(a), plural rows of slender grooves are formed in parallel on a flat plate 10. As shown in FIG. 5(b), pair of the flat plates 10 are bonded to each other to form the planar nozzle 13. A row of plural melt passages 14 are formed in the nozzle 13. A reference numeral 12 denotes a joint.

The crucible 15 is constituted by a peripheral wall 15a and a bottom wall 15b, and the nozzle 13 is attached to a central portion of the bottom wall 15b such that each of the passages 14 is communicated with the interior of the crucible 15. A melt 16 is placed in the crucible 15.

A heater 20 is buried in an upper furnace body 19. The nozzle 13 extends downwardly from the lower end of the crucible 15, and the passages 14 are opened at a bottom face 13a of the nozzle 13. A lower furnace body 21 is arranged to surround the nozzle 13 and a surrounding space 30, and a heater 22 is buried in the lower furnace body 21. Each of the crucible 15 and the nozzle 13 is made of a corrosion-resistant conductive material. As a matter of course, the configuration of the heating furnace can be changed in various ways. For example, in FIG. 4, the heating furnace is divided into two zones, but the heating furnace may be divided into three or more zones.

One electrode of an electric source 25A is connected to the crucible 15 at a location C via a wire 26, whereas the other electrode is connected to a interface location D between the peripheral wall and the bottom wall of the crucible 15 via a wire 26. One electrode of an electric source 25B is connected to the nozzle 13 at a location E via a wire 26, whereas the other electrode is connected to the lower end F of the nozzle 13 via a wire 26. These two electricity feed systems are electrically separated from each other, and their voltages can be independently controlled.

An after-heater 29 is provided spaced from the nozzle 13 and surrounding the nozzle 13. If the temperature gradient of the nozzle is optimized by the furnace body (heater and refractory), such an after-heater 29 is not always necessary.

The upper furnace body 19, the lower furnace body 21 and the after-heater 29 are heated to appropriately set the temperature distribution inside the spaces 18 and 30, raw materials for the melt are fed in the crucible 15, and the raw materials are heated by applying the electric power to the crucible 15 and the nozzle 13. In this state, the melt 16 slightly projects outwardly from openings 14a of the passages 14 in a single crystal-growing section 40 at the lower end portion of the nozzle 13, and the melt is held there in the form of a relatively flat surface by its surface tension.

The gravity applied to the melt inside the nozzle 13 is largely reduced, because the melt contacts the wall surfaces of the passages 14. Particularly when the inner diameter of each of the passages 14 is set at not more than 0.5 mm, the influence of the surface tension is more dominant near the single crystal-growing section 40 than that of the gravity, so that the solid liquid interface can be uniformly formed.

In this state, an end face of a seed crystal 23 is contacted with the surfaces of the melt drawn down from the openings 14a of the passages 14, and the seed crystal is pulled downwardly. At that time, a uniform solid liquid interface (meniscus) is formed between the upper end of the seed crystal 23 and the melt drawn downwardly thorough each of the passages 14. The melt inside the crucible 15 draws down thorough each of the passages 14 of the nozzle 13, and comes out through the passage 14. Then, the melts coming out through the respective passages 14 are united together at the bottom face 13a of the nozzle 13, which becomes a solid phase immediately under the bottom face 13a. As a result, a planar single crystal 17 is pulled out downwardly under the nozzle 13.

Consequently, as shown in FIG. 4, the single crystal substrate 17 is continuously formed on the upper side of the seed crystal 23, and pulled downwardly. In this embodiment, the seed crystal 23 and the single crystal substrate 17 are transferred downwardly by means of rollers 24.

In the above producing process, the inner diameter of each of the passages 14 is preferably 0.01 mm to 0.5 mm. The space between the adjacent passages 14 is preferably 0.1 to 10 mm. Further, the cross sectional shape of each of the passage 14 may be rectangular, V-shaped or semi-circular.

Figure 6:
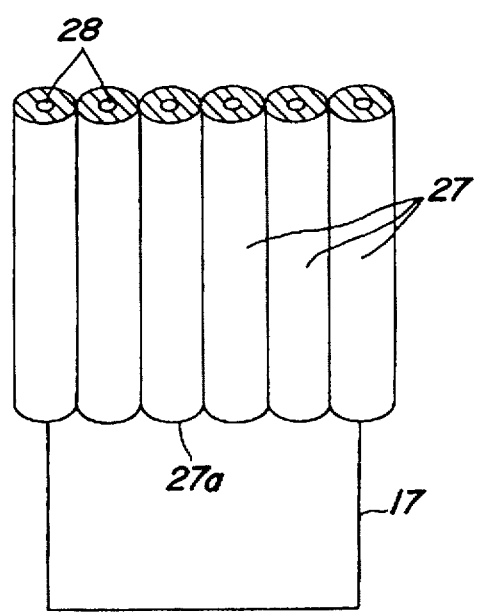
FIG. 6 is a perspective view of another preferable nozzle for the production of a single crystal substrate.

In an embodiment of FIG. 6, a tubular member 27 is used as each nozzle, and plural tubular members 27 are arrayed in a line in the state that the outer peripheries of the tubular members continue to adjacent one or ones. In FIG. 6, a crucible is omitted, but the crucible 15 shown in FIG. 5(c) may be used. A melt passage 28 is formed in each nozzle 27, and the passage 28 is opened at a bottom face 27a at the lower end of the tubular body 27.

The melt in the crucible draws down inside the passage 28 of each of the nozzles 27, and comes out through the passage 28. At that time, the melts coming out through the passages 28 are united together at the bottom face 27a of the nozzles 27, and become a solid phase. Then, the planar single crystal 17 is pulled downwardly through the nozzles 27.

In the following, more specific concrete experimental results will be explained.

Experiment 1
Production of a KLNT Single Crystal Plate by Micro Pulling Down Process A KLNT single crystal plate was produced according to the above-mentioned producing process by using a single crystal producing apparatus as shown in FIGS. 4 and 5(a) to 5(c). The temperature of the entire furnace was controlled by the upper furnace portion 19 and the lower furnace portion 21. The temperature gradient of near the single crystal-growing portion 40 was controlled by feeding electric power to the nozzle 13 and generating heat through the after-heater 29. A single crystal pulling-down mechanism was used to pull down the single crystal plate at a uniformly controlled vertical pulling down speed of 2 to 200 mm/h.

A starting material powder was prepared by mixing potassium carbonate, lithium carbonate, niobium oxide and tantalum oxide at a compounding recipe of 30:20:40:10 in terms of molar ratio. Fifty grams of this starting material powder was fed into the crucible 15 made of platinum, which was set at a given location. The temperature of the space 18 inside the upper furnace body 19 was adjusted to a range of 1100° C. to 1200° C., thereby melting the starting material inside the crucible 15. The temperature of the space 30 inside the lower furnace body 21 was uniformly controlled to 500° C. to 1000° C. While given electric powers are applied to the crucible 15, the nozzle 13 and the after-heater 29, a single crystal was grown. At that time, the temperature of the single crystal-growing section could be set at 1050° C. to 1150° C., and the temperature gradient of the single crystal section could be controlled to 10° to 150° C./mm.

As the flat plate 10, a plate made of platinum having a dimension of 30 mm×30 mm×0.6 mm was used. Grooves 11 were formed on this platinum plate by mechanical cutting using a dicing machine such that the interval between the grooves 11 was 5 mm and the width of each groove 11 was 0.1 mm. A planar nozzle 13 having a thickness of 1.2 mm was formed by joining such two platinum plates 10. As explained with reference to FIGS. 5(a) to 5(c) the melt was drawn down through the passages 14. In this state, a single crystal plate having a C face was pulled down at a speed of 20 mm/h forward an a-axis direction, and a KLNT single crystal plate having a C face having a thickness of 1 mm and a width of 30 mm could be successfully pulled down.

Further, with respect to the thus grown single crystal plate, the composition distribution was examined as viewed in the length direction (growing direction). More specifically, light beams having an SHG phase matching wavelength were irradiated on every portion of the single crystal plate as viewed in a thickness direction, and the wavelength of waves emitted were measured. Even if the composition of the KLNT single crystal slightly varies, the SHG phase matching wavelength changes. The measurement of the wavelength of the output waves revealed that the composition of the KLNT single crystal could be controlled at a high accuracy not every attained, i.e., within not more than 1 nm, in other words not more than 0.01 mol % in terms of the composition. A theoretical efficiency of second harmonic generation was obtained as a measurement value within a measurement error of about ±2%. This plate was used as a substrate for the formation of the optical waveguide.

Formation of a KLN single crystal film by the liquid phase epitaxial growth process An epitaxial film was formed on the single crystal substrate by the liquid phase epitaxial growth process. More specifically, an oxide type starting material in which K:Li:Nb=33:22:45 in molar ratio was put in the platinum crucible, and melted at 1010° C. The temperature of the melt was lowered to an supercooled state at a cooling rate of about 1° C./h. A main surface of the above KLNT single crystal substrate was contacted with the melt for about 30 minutes, and an epitaxial film having a thickness of about 10 µm was successfully formed. The composition of this epitaxial film was K:Li:Nb=30:20:50 in molar ratio.

Poling treatment for single domain of an epitaxial film, formation of an optical waveguide and measurement of second harmonic generation Platinum electrodes were placed on opposite surfaces of the above single crystal substrate, and the single crystal substrate was placed in the electric furnace. After the substrate was heated to 600° C., a poling treatment was effected by applying DC voltage to the substrate. Then, the characteristics of the epitaxial film were evaluated. It was confirmed that the epitaxial film had a composition which phase matching wavelength is 850 nm, and that both the ordinary index $n_o$ and the extra-ordinary index $n_e$ of the epitaxial film were greater than that of the single crystal substrate. Further, a variation in these refractive indices in a plane was not observed in a range of a measurement accuracy. The thus obtained epitaxial film was mirror polished to a thickness of 3.0±0.1 µm.

A film of titanium having a thickness of 600 angstroms was formed as a mask on the epitaxial film on the single crystal substrate by a lift off process so that a linear optical waveguides 3 may each have a planar width of 4 µm. The resulting single crystal substrate was subjected to an RF plasma etching with argon ions, thereby forming the rib-shaped optical waveguides 3 having a width of 4 µm and a height of 3 µm. The etching condition was that an RF power was 200 W, the entire gas pressure was 0.06 Pa, and the etching rate was 10 nm/min.

The rib-shaped optical waveguides 3 were cut from the above single crystal substrate, and an optical waveguide elements 5 as shown in FIG. 2(a) were produced. The length as viewed in an optical waveguide-extending direction of the optical waveguide element 5 was 7 mm, and the width of the optical waveguide element 5 was 2 mm. Totally 60 (=15×4) of the optical waveguide elements 5 could be produced from a single crystal substrate.

A semiconductor laser oscillator 7 (output: 150 mW, wavelength: 850 nm) was directly coupled to one of end faces of the optical waveguide 3, a semiconductor laser beam was introduced into this one end face of the optical waveguide 3 under TE mode, and a blue light by second harmonic generation having a wavelength of 425 nm was emitted from the other end face of the optical waveguide 3. As a result, an output of about 15 mW was obtained with a single mode exitation. In this output, completely no optical damage phenomena was observed for the optical waveguide 3. Further, with respect to all the optical waveguide elements 5 obtained, variations in the phase matching wavelength were not more than 0.05 nm, and variations in the output of the blue light by second harmonic generation were within a range of ±2%. As mentioned above, the device according to the present invention has extremely excellent characteristics as the blue laser by second harmonic generation.

Experiment 2

A KLN single crystal plate was produced in the same manner as in Experiment 1 except that as a raw material powder was used prepared by mixing potassium carbonate, lithium carbonate and niobium oxide at a compounding recipe of 30:20:50 in terms of molar ratios was used. The growth speed was 25 mm/h, the growing was effected in an a-axis direction, and the orientation of a seed crystal was selected to give a plate having a c face. The width of the plate 10 was 50 mm. Under the above condition, a single crystal plate was pulled down, and a KLN single crystal plate having a thickness of 1 mm and a width of 50 mm was successfully pulled down.

Formation of a KLNT single crystal film and a KLN single crystal film by the liquid phase epitaxial growth process Then, an epitaxial film was formed on a substrate made of the above single plate by the liquid phase epitaxial growth process. More specifically, a flux in which potassium oxide and vanadium oxide were mixed at K:V=50:50 in molar ratios was added to a mixture in which potassium oxide, lithium oxide, niobium oxide and tantalum oxide were mixed at K:Li:Nb:Ta=30:20:42:8 in molar ratios, and the mixture was melted in the platinum crucible. A saturated temperature of this mixture was set at about 900° C. The temperature of the melt was lowered to a supercooled state (the degree of supercooling is 10° C.) at a cooling rate of about 1° C./h. Each of totally ten KLN single crystal substrates was hanged vertically from a jig made of platinum, and immersed in the melt. After it was kept immersed for 15 minutes, an epitaxial film 32 could be grown in a thickness of about 20 µm. The composition of the epitaxial film 32 was K:Li:Nb:Ta=30:20:40:10 in molar ratios.

Next, a flux in which potassium oxide and vanadium oxide were mixed at K:V=50:50 in molar ratios was added to a mixture in which potassium oxide, lithium oxide and niobium oxide were mixed at K:Li:Nb=30:20:50 in molar ratios, and the mixture was melted in the platinum crucible. A saturated temperature of this mixture was set at about 900° C. The temperature of the melt was lowered to a supercooled state (the degree of supercooling is 10° C.) at a cooling rate of about 1° C./h. The single crystal substrate obtained above was immersed in the melt. After it was kept immersed for about 10 minutes, an epitaxial film 33 could be grown in a thickness of about 10 µm. The composition of the epitaxial film 32 was K:Li:Nb=30:20:50 in molar ratios.

Poling treatment for single domain of an epitaxial film, formation of an optical waveguide and measurement of second hrmonic generation With respect to each of the totally ten KLN single crystal substrates, platinum electrodes were placed on opposite surfaces thereof, and the single crystal substrate was placed in the electric furnace. After the substrate was heated to 600° C., a poling treatment was effected by applying DC voltage to the substrate. Then, the characteristics of the KLN epitaxial film 33 were evaluated. It was confirmed that the epitaxial film had a composition which phase matching wavelength is 850 nm, and that both the ordinary index $n_o$ and the extra-ordinary index $n_e$ of the epitaxial film 33 were greater than that of the KLNT epitaxial film 32. Further, a variation in these refractive indices in a plane was not observed in a range of a measurement accuracy. The thus obtained epitaxial film was mirror polished to a thickness of 3.5±0.1 µm.

A film of titanium having a thickness of 400 angstroms was formed as a mask on the epitaxial film 33 on the single crystal substrate by the lift off process so that a linear optical waveguides 3 may each have a planar width of 5 µm. The resulting single crystal substrate was subjected to an electron cyclotron resonance type reactive ion etching with use of $C_3F_6$ gas (ECR-RIE), thereby forming the rib-shaped optical waveguides 3 having a width of 5 µm and a height of 3.5 µm. The etching condition was that a microwave power was 400 W, the entire gas pressure was 0.01 Torr, and the etching rate was 40 nm/min.

The rib-shaped optical waveguides 35 were cut from the above single crystal substrate, and optical waveguide elements 36 as shown in FIG. 3(c) were produced. The length as viewed in an optical waveguide-extending direction of the optical waveguide element 36 was 7 mm, and the width of the optical waveguide element 36 was 2 mm. A chip was produced by optically polishing the opposite end faces of the optical waveguide. In this case, totally 140 (=7×20) of the optical waveguide elements 36 could be produced from a single crystal substrate. Thus, totally 1400 of the optical waveguide elements 36 could be produced from the ten single crystal substrates.

The semiconductor laser oscillator 7 (output: 150 mW, wavelength: 850 nm) was directly coupled to one of end faces of the optical waveguide 35, a semiconductor laser beam was introduced into this one end face of the optical waveguide 35 under TE mode, a blue light by second harmonic generation having a wavelength of 425 nm was emitted from the other end face of the optical waveguide 35 and its output was measured. As a result, the output of about 17 mW was obtained with single mode exitation. With this output, completely optical damage phenomena was not observed for the optical waveguide 35. Further, with respect to all the optical waveguide elements 36 obtained, variations in the phase matching wavelength were not more than 0.05 nm, and variations in the output of the blue light by second harmonic generation were within a range of ±2%. As mentioned above, the device according to the present invention has extremely excellent characteristics as the blue laser by second harmonic generation.

In the following producing process, a KLN or KLNT single crystal fiber obtained by the micro pulling down process is used as a single crystal substrate. When such a KLN or KLNT single crystal fiber is directly used as the substrate for the second harmonic generation element, the above-mentioned step of producing the optical wavelength elements by cutting the single crystal substrate can be simplified. Thus, this is more advantageous from the standpoint of the productivity.

Experiment 3
Production of a KLN single crystal substrate by the micro pulling down process A KLN single crystal substrate was produced by the same process as in Experiment 1 except that the nozzle under the crucible was a nozzle made of a single tubular member made of platinum in this experiment, and the outer size of the nozzle was 2.5 mm×0.8 mm. A single crystal was pulled downwardly in an a-axis direction at a speed of 30 mm/h, and a fibrous single crystal was successively pulled down. The single crystal fiber was cut when it reached a length of 75 mm. The fibrous single crystal had a cross sectional rectangular shape of 2.0 mm in width×0.5 mm in length. The orientation of a seed crystal was selected such that faces corresponding to the width of 2.0 mm might be C faces.

With respect to the thus grown single crystal fiber, the composition distribution was examined as viewed in the length direction (growing direction). More specifically, waves having an SHG phase matching wavelength were irradiated every portion of the single crystal plate as viewed in a thickness direction, and the wavelength of waves emitted were measured. The measurement of the wavelength of the output waves revealed that the composition of the KLNT single crystal could be controlled at a high accuracy not every attained, i.e., within not more than 1 nm, in other words not more than 0.01 mol % in terms of the composition. A theoretical efficiency of second harmonic generation was obtained as a measurement value within a measurement error of about ±2%.

Formation of a KLN single crystal film by the liquid phase epitaxial process

An epitaxial film was formed on the single crystal substrate by the liquid phase epitaxial growth process. More specifically, an oxide type starting material in which K:Li:Nb=33:22:47 in molar ratio was put in the platinum crucible, and melted at 1030° C. The temperature of the melt was lowered to an supercooled state at a cooling rate of about 1° C./h. Each of totally 300 of the single crystal fibers grown above by the micro pulling down method was set by the platinum jig, and hanged down, and immersed into the melt. The fiber was kept immersed into the melt for about 30 minutes, and an epitaxial film having a thickness of about 10 µm was successfully formed. The composition of this epitaxial film was K:Li:Nb=30:17:53 in molar ratio.

Poling Treatment for Single Domain of an Epitaxial Film, Formation of an optical waveguide and measurement of second harmonic generation Shelves were arranged in ten stages, and 30 single crystal fibers were placed on each of the shelves in a plane such that the faces corresponding to the width of 2.0 mm (c faces) might be upwardly and downwardly directed. Platinum electrodes were placed on opposite surfaces of each of the 2.0 mm wide faces of each of the single crystal fibers. After the substrate was heated to 600° C. in the electric furnace, a poling treatment was effected by applying DC voltage to the fibers. Then, the characteristics of the epitaxial film were evaluated. It was confirmed that the epitaxial film had a composition which phase matching wavelength is 850 nm, and that both the ordinary index $n_o$ and the extra-ordinary index $n_e$ of the epitaxial film were greater than that of the single crystal fiber. Further, a variation in those refractive indices in a plane was not observed in a range of a measurement accuracy. The thus obtained epitaxial film at the c faces of the single crystal fiber was mirror polished to a thickness of 5.0±0.1 µm.

A film of titanium having a thickness of 600 angstroms was formed as a mask on the epitaxial film on each of 300 single crystal fibers by the lift off process so that a linear optical waveguides 3 may each have a planar width of 6 µm. The resulting single crystal fiber was subjected to the RF plasma etching with argon ions, thereby forming the rib-shaped optical waveguides 3 having a width of 6 μm and a height of 5 μm. The etching condition was that an RF power was 200 W, the entire gas pressure was 0.06 Pa, and the etching rate was 10 nm/min.

The rib-shaped optical waveguides were cut from the above single crystal fiber, and optical waveguide elements 5 as shown in FIG. 2(a) were produced. The length as viewed in an optical waveguide-extending direction of the optical waveguide element 5 was 7 mm, and the width of the optical waveguide element 5 was 2 mm. The optical fiber elements 5 having the length of 7 mm could be obtained by appropriately cutting the single optical fiber, while the width of the single optical fiber was fixedly set at 2 mm, which required no cutting step in the width direction. In this case, 10 optical waveguide elements 5 could be produced from one single crystal fiber.

The semiconductor laser oscillator 7 (output: 150 mW, wavelength: 850 nm) was directly coupled to one of end faces of the optical waveguide 3, a semiconductor laser beam was introduced into this one end face of the optical waveguide 3 under TE mode, and a blue light by second harmonic generation having a wavelength of 425 nm was emitted from the other end face of the optical waveguide 3. As a result, an output of about 12 mW was obtained with a single mode exitation. In this output, completely optical damage phenomena was not observed for the optical waveguide 3. Further, with respect to all the optical waveguide elements 5 obtained, variations in the phase matching wavelength were not more than 0.05 nm, and variations in the output of the blue light by second harmonic generation were within a range of ±2%. As mentioned above, the device according to the present invention has extremely excellent characteristics as the blue laser by second harmonic generation.

As mentioned above, the present invention can provide the second harmonic generation element which can generates a blue laser beam, has a simple structure to make its assembling easy, requires neither quasi-phase matching nor high accuracy domain controlling, has a wide temperature acceptance for the phase matching, and is not optically damaged even if a high energy is concentrated upon the element.

What is claimed is:

1. A second harmonic generation element comprising a single crystal substrate having a fundamental composition of $K_3Li_{2-2x}(Nb_{1-y}Ta_y)_{5+5z}O_{15-x+12.5z}$ and an optical waveguide made of an epitaxial film with a fundamental composition of $K_3Li_{2-2a}(Nb_{1-b}Ta_b)_{5+5c}O_{15-a+12.5c}$ and refractive index different from that of the single crystal substrate, wherein:

$-0.5 \leq a, x \leq 0.625$ $0 \leq b, y \leq 0.5$ $0.8 \leq (5-2x)/(5+5z), (5-2a)/(5+5c) \leq 1.2$.

2. The second harmonic generation element set forth in claim 1, wherein said single crystal substrate is a single crystal substrate formed by a micro (μ) pulling down method.

3. A process for producing the second harmonic generation element set forth in claim 2, said process comprising the step of growing said epitaxial film by contacting said single crystal substrate with a melt containing at least elements constituting said epitaxial film.

4. The producing process set forth in claim 3, wherein said melt further comprises vanadium.

5. The producing process set forth in claim 3, wherein said melt further comprises vanadium and potassium.

6. A process for producing the second harmonic generation element set forth in claim 1, said process comprising the step of growing said epitaxial film by contacting said single crystal substrate with a melt containing at least elements constituting said epitaxial film.

7. The producing process set forth in claim 6, wherein said melt further comprises vanadium.

8. The producing process set forth in claim 6, wherein said melt further comprises vanadium and potassium.

9. The second harmonic generation element set forth in claim 1, wherein said optical waveguide is formed directly on the single crystal substrate, and the refractive index of the optical waveguide is greater than that of the single crystal substrate.

10. The second harmonic generation element set forth in claim 9, wherein said single crystal substrate is a single crystal substrate formed by a micro (μ) pulling down method.

11. A process for producing the second harmonic generation element set forth in claim 10, said process comprising the step of growing said epitaxial film by contacting said single crystal substrate with a melt containing at least elements constituting said epitaxial film.

12. The producing process set forth in claim 11, wherein said melt further comprises vanadium.

13. The producing process set forth in claim 11, wherein said melt further comprises vanadium and potassium.

14. A process for producing the second harmonic generation element set forth in claim 9, said process comprising the step of growing said epitaxial film by contacting said single crystal substrate with a melt containing at least elements constituting said epitaxial film.

15. The producing process set forth in claim 14, wherein said melt further comprises vanadium.

16. The producing process set forth in claim 14, wherein said melt further comprises vanadium and potassium.

17. The second harmonic generation element set forth in claim 1, wherein an intermediate film made of an epitaxial film having a fundamental composition of $K_3Li_{2-2d}(Nb_{1-e}Ta_e)_{5+5f}O_{15-d+12.5f}$ is formed on said single crystal substrate, said optical waveguide is formed on the intermediate film, the refractive index of the optical waveguide is greater than that of the intermediate film, and d, e and f satisfy the following inequalities:

$-0.5 \leq d \leq 0.625$ $0 \leq e \leq 0.5$ $0.8 \leq (5-2d)/(5+5f) \leq 1.2$.

18. The second harmonic generation element set forth in claim 17, wherein said single crystal substrate is a single crystal substrate formed by a micro (μ) pulling down method.

19. A process for producing the second harmonic generation element set forth in claim 18, said process comprising the step of growing said epitaxial film by contacting said single crystal substrate with a melt containing at least elements constituting said epitaxial film.

20. The producing process set forth in claim 19, wherein said melt further comprises vanadium.

21. The producing process set forth in claim 19, wherein said melt further comprises vanadium and potassium.

22. A process for producing the second harmonic generation element set forth in claim 17, said process comprising the step of growing said epitaxial film by contacting said single crystal substrate with a melt containing at least elements constituting said epitaxial film.

23. The producing process set forth in claim 22, wherein said melt further comprises vanadium.

24. The producing process set forth in claim 22, wherein said melt further comprises vanadium and potassium.

25. The second harmonic generation element set forth in claim 1, wherein the epitaxial film constituting the optical waveguide is a film formed by epitaxial growth in liquid phase.

26. The second harmonic generation element set forth in claim 25, wherein said single crystal substrate is a single crystal substrate formed by a micro (μ) pulling down method.

27. A process for producing the second harmonic generation element set forth in claim 26, said process comprising the step of growing said epitaxial film by contacting said single crystal substrate with a melt containing at least elements constituting said epitaxial film.

28. The producing process set forth in claim 27, wherein said melt further comprises vanadium.

29. The producing process set forth in claim 27, wherein said melt further comprises vanadium and potassium.

30. A process for producing the second harmonic generation element set forth in claim 25, said process comprising the step of growing said epitaxial film by contacting said single crystal substrate with a melt containing at least elements constituting said epitaxial film.

31. The producing process set forth in claim 30, wherein said melt further comprises vanadium.

32. The producing process set forth in claim 30, wherein said melt further comprises vanadium and potassium.

* * * * *